(12) United States Patent
Rothman

(10) Patent No.: US 11,322,637 B2
(45) Date of Patent: May 3, 2022

(54) SAM PHOTODIODE WITH MULTIPLICATION OF A SINGLE TYPE OF CARRIER IN A PERIODIC MULTILAYER REGION

(71) Applicant: COMMISSARIAT À L'ÉNERGIE ATOMIQUE ET AUX ÉNERGIES ALTERNATIVES, Paris (FR)

(72) Inventor: Johan Rothman, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/692,379

(22) Filed: Nov. 22, 2019

(65) Prior Publication Data

US 2020/0168756 A1 May 28, 2020

(30) Foreign Application Priority Data

Nov. 27, 2018 (FR) ...................................... 1871956

(51) Int. Cl.
*H01L 29/861* (2006.01)
*H01L 21/00* (2006.01)
*H01L 31/107* (2006.01)

(52) U.S. Cl.
CPC ................................ *H01L 31/1075* (2013.01)

(58) Field of Classification Search
CPC .......................... H01L 31/1075; H01L 27/3227
USPC ............................ 438/91, 380, 983; 257/603
See application file for complete search history.

(56) References Cited

U.S. PATENT DOCUMENTS

| 4,326,211 | A * | 4/1982 | Smeets ................ H01L 31/107 |
| | | | 257/438 |
| 6,747,296 | B1 | 6/2004 | Clark |
| 8,975,718 | B2 * | 3/2015 | Rothman .......... H01L 31/02966 |
| | | | 257/438 |
| 9,013,019 | B2 * | 4/2015 | Rothman .............. H01L 31/107 |
| | | | 257/438 |
| 9,276,162 | B2 | 3/2016 | Yasuoka et al. |
| 9,406,831 | B2 * | 8/2016 | Rothman ............. H01L 31/1075 |
| 10,559,706 | B2 * | 2/2020 | Rothman .......... H01L 31/02966 |
| 2007/0158664 | A1 | 7/2007 | Rothman |
| 2010/0025654 | A1 | 2/2010 | Robin et al. |
| 2013/0221193 | A1 | 8/2013 | Williams et al. |
| 2014/0183682 | A1 | 7/2014 | Rothman |
| 2014/0183683 | A1 | 7/2014 | Rothman |

(Continued)

OTHER PUBLICATIONS

Preliminary French Search Report for FR Application No. 1871956 dated Aug. 20, 2019.

(Continued)

*Primary Examiner* — Calvin Lee
(74) *Attorney, Agent, or Firm* — Pearne & Gordon LLP

(57) ABSTRACT

An avalanche photodiode including an absorption region, a collection region and a multiplication region between the absorption region and the collection region that performs a carrier multiplication by impact ionisation of a single type of carrier. The multiplication region includes a plurality of multilayer structures where each multilayer structure includes, from the absorption region to the collection region, an acceleration layer having a first energy band gap then a multiplication layer having a second energy band gap. The first energy band gap is greater than the second energy band gap.

12 Claims, 5 Drawing Sheets

(56) References Cited

U.S. PATENT DOCUMENTS

| | | |
|---|---|---|
| 2014/0319580 A1 | 10/2014 | Mollard et al. |
| 2014/0346539 A1 | 11/2014 | Mollard et al. |
| 2015/0303320 A1 | 10/2015 | Boulard et al. |
| 2015/0340537 A1 | 11/2015 | Rothman |
| 2016/0111580 A1 | 4/2016 | Gravrand et al. |
| 2017/0309663 A1 | 10/2017 | Rothman |
| 2018/0013030 A1 | 1/2018 | Rothman |
| 2018/0337210 A1 | 11/2018 | Rothman |
| 2018/0374881 A1 | 12/2018 | Rothman |
| 2019/0383969 A1 | 12/2019 | Badano et al. |

OTHER PUBLICATIONS

Huntington, Andrew S. et al. "Improved breakdown model for estimating dark count rate in avalanche photodiodes with InP and InAlAs multiplication layers" IN: Article in Proceedings of SPIE—The International Society for Optical Engineering, May 5, 2006, vol. 6214.

Rothman, Johan, Physics and Limitations of HgCdTe APDs: A Review: IN: Journal of Electronic Materials, Jul. 2, 2018.

Rothman, Johan, "History-Dependent Impact Ionization Theory Applied to HgCdTe e-APDs" IN: Journal of Electronic Materials, Nov. 8, 2011, vol. 40, pp. 1757-1768.

Williams, George et al. Milti-gain-stage InGaAs Avalanche Photodiode with Enhanced Gain and Reduced Excess Noise, 2013 IEEE, pp. 1-13.

Capasso, Federico et al. Staircase Solid-State Photomultipliers and Avalanche Photodiodes with Enhanced Ionization Rates Ratio, IEEE Transaction On Electron Devices, Apr. 1983, vol. ED-3., No. 4, pp. 381-390.

Chin, R. et al., "Impact Ionisation in multilayered heterojunction structures" Electronics Letters, Jun. 5, 1980, vol. 16, No. 12, pp. 467-469.

* cited by examiner

SAM PHOTODIODE WITH MULTIPLICATION OF A SINGLE TYPE OF CARRIER IN A PERIODIC MULTILAYER REGION

The project behind this patent application received financing from the European Union's Horizon 2020 Research and Innovation Programme, in respect of grant agreement n° 776390.

CROSS-REFERENCE TO RELATED APPLICATIONS

This application claims priority from French Patent Application No. 1871956 filed on Nov. 27, 2018. The content of this application is incorporated herein by reference in its entirety.

TECHNICAL FIELD

The invention relates to avalanche photodiodes, and more particularly photodiodes with separate absorption and multiplication zones (called SAM-APD for Separate Absorption and Multiplication region-Avalanche PhotoDiodes) that perform carrier multiplication by impact ionisation of a single type of carrier.

PRIOR ART

Certain applications for detecting light by means of an avalanche photodiode, such as remote sensing by LIDAR (Light Detection And Ranging) laser, quantum optics or free space telecommunications, require the detection of a low number of photons per observation time. Yet, the conservation of the information contained by a flux of photons is fundamentally limited by the quantum efficiency of the photodiode, which describes its capacity to transform each incident photon into an electrical signal, and by the excess noise factor of the photodiode, which translates the noise added by the multiplication of the electrical charges produced by the photodiode.

An important step towards photodiodes with reduced excess noise value was made with the arrival of materials such as mercury cadmium tellurides CdHgTe, which make it possible to obtain carrier multiplication by impact ionisation dominant for one type of carrier. Indeed, such materials make it possible to avoid, as notably demonstrated in the review article of J. Rothman entitled "Physics and Limitations of HgCdTe APDs: A Review", Journal of Electronic Materials, 2018, a parasitic interaction between the two types of carriers circulating in the multiplication zone. The result is an important reduction in the noise generated in this zone and an improved response time.

This article thus reports, for a SAM-ADP photodiode based on CdHgTe having a multiplication layer produced with a constant Cd composition, an excess noise factor F of the order of 1.2 to 1.3. This low value is due not only to a multiplication of carriers in the multiplication layer that is exclusively initiated by electrons but also by the presence of a dead space effect that tends to spatially group together the multiplication events. As a comparison, avalanche photodiodes based on III-V or Si semiconductor are characterised by a multiplication of the two types of carriers and the values of excess noise factor F observed are greater than 2 for photodiodes based on Si, and greater than 3 or even 5 for photodiodes based on III-V materials.

If the low excess noise value of a SAM photodiode with multiplication of a single type of carrier makes it one of the most efficient detectors for applications that involve the detection of a small number of photons, the fact remains that this level of excess noise may remain problematic for certain applications, such as the detection of single photons where it can prevent distinguishing with certainty the detection of one or two photons.

DESCRIPTION OF THE INVENTION

The objective of the invention is to provide a SAM photodiode with carrier multiplication by impact ionisation of a single type of carrier that has increased sensitivity, characterised by a reduced excess noise factor F.

To this end, the invention proposes an avalanche photodiode including an absorption region, a collection region and a multiplication region between the absorption region and the collection region that performs a carrier multiplication by impact ionisation of a single type of carrier. The multiplication region includes a plurality of multilayer structures where each multilayer structure includes, from the absorption region to the collection region, a first layer having a first energy band gap then a second layer having a second energy band gap. The first energy band gap is greater than the second energy band gap.

Certain preferred but non-limiting aspects of this photodiode are the following:

in each multilayer structure, the first layer has a carrier multiplication rate per micrometre having a first saturation value after a first dead space distance, the second layer has a carrier multiplication rate per micrometre having a second saturation value after a second dead space distance and the first layer has a thickness that is at least equal to the second dead space distance and less than the first dead space distance;

in each multilayer structure, the second layer has a thickness greater than a multiplication distance corresponding to the inverse of the second saturation value, preferably at least two times greater than said multiplication distance;

in each multilayer structure, the thickness of the second layer is less than the second dead space distance;

each multilayer structure has a thickness less than the first dead space distance;

the first layer of the multilayer structure in contact with the absorption region is thicker than the first layer of the or other multilayer structures;

each multilayer structure includes, from the absorption region to the collection region, a layer with negative energy band gap gradient between the first layer and the second layer and a layer with positive energy band gap gradient after the second layer, the negative energy band gap gradient going from the first energy band gap to the second band gap;

the positive energy band gap gradient goes from the second energy band gap to the first energy band gap;

the layer with positive band gap gradient is thicker than the layer with negative energy band gap gradient;

the first and second band gaps and the thicknesses of the first and second layers decrease from one multilayer structure to the other from the absorption region to the collection region;

it further includes an acceleration layer of carriers of said single type between the multiplication region and the collection region;

the absorption region has an energy band gap that decreases in the direction of the multiplication region.

BRIEF DESCRIPTION OF THE DRAWINGS

Other aspects, aims, advantages and characteristics of the invention will become clearer on reading the following detailed description of preferred embodiments thereof, given by way of example and non-limiting, and made with reference to the appended drawings in which.

DETAILED DESCRIPTION OF PARTICULAR EMBODIMENTS

The invention relates to a SAM-APD photodiode with separate absorption and multiplication zones that performs carrier multiplication by impact ionisation of a single type of carrier (so-called SCM, Single Carrier Multiplication). "Carrier multiplication by impact ionisation of a single type of carrier" is taken to mean that the multiplication by impact of one of the types of carrier (holes for example) is negligible vis-à-vis the multiplication by impact of the other type of carrier (electrons in this example), that is to say that the ratio between the two multiplication rates is greater than 50, preferentially 100, or even 1000.

In the remainder of the description, the photodiode is based on mercury cadmium telluride, that is to say made of a material including tellurium and at least one element selected from cadmium and mercury and complying with the following formulation $Cd_xHg_{1-x}Te$ with the value x corresponding to the proportion of cadmium with respect to mercury that is comprised between 0 and 1, 0 and 1 included. Nevertheless, the invention is not only limited to photodiodes made from mercury-cadmium telluride and also encompasses any type of structure of which the design makes it possible to obtain a dominant multiplication for one type of carrier, for example by resorting to indium arsenides-antimonides of the type $InAs_{1-x}Sb_x$.

Figure 1:
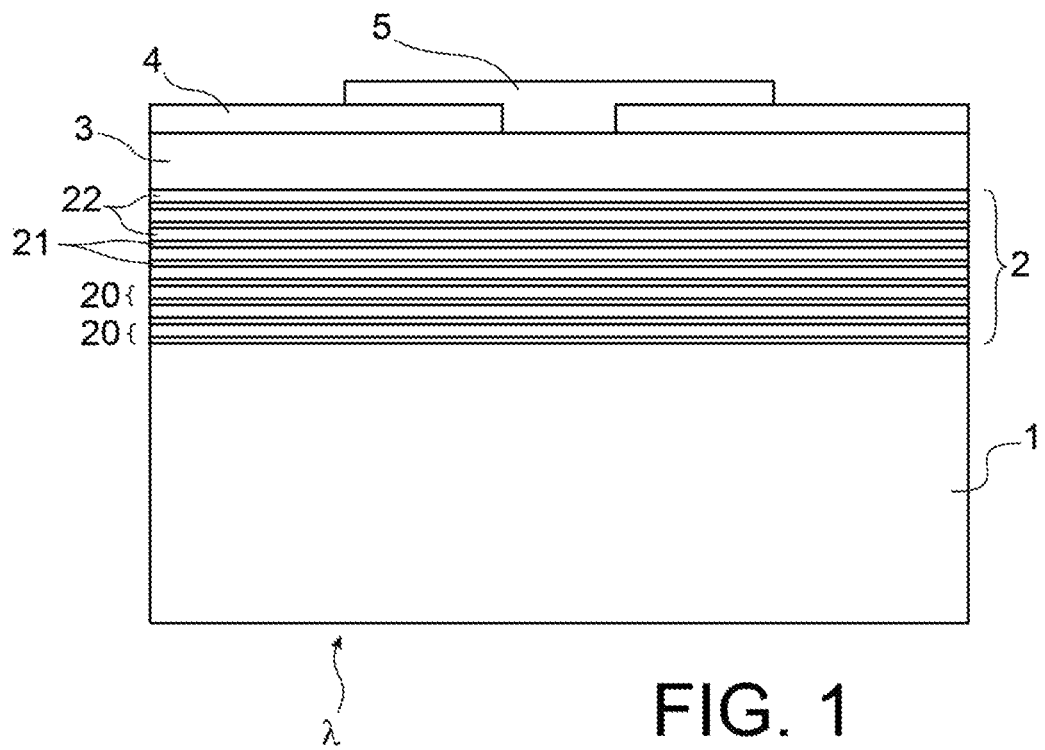
FIG. 1 is a diagram according to a sectional view of a photodiode conforming to the invention.

With reference to FIG. 1, the invention relates to an avalanche photodiode intended for the detection and the measurement of an electromagnetic radiation λ of which the wavelength is comprised in a given range of wavelengths, for example a wavelength of 1.55 μm comprised in the near infrared range of wavelengths.

The photodiode is for example produced by means of growth by molecular beam epitaxy of the material CdHgTe, the cadmium composition of which may be modulated in order to vary the energy band gap.

The photodiode includes an absorption region 1, a collection region 3 and a multiplication region 2 between the absorption region and the collection region. The multiplication region 2 performs a carrier multiplication by impact ionisation dominant for electrons (i.e. the multiplication of holes is negligible vis-à-vis the multiplication of electrons).

The absorption region 1 has a first face on which the light is incident. This region is characterised by a P-type of conductivity and a doping level typically greater than $10^{16}$ $cm^{-3}$. The thickness and the cadmium composition of this region are adapted to the targeted wavelength for each application. To detect photons of 1.55 μm wavelength, the thickness is typically of the order of 1.5 to 3 μm and the level of cadmium x is typically greater than 0.3, for example greater than 0.45.

The electrons generated in the absorption region 1 are transported by drift or diffusion to the multiplication region 2. The multiplication region 2 is characterised by a low doping level compared to the absorption region, typically less than $10^{16}$ $cm^{-3}$, in order to establish a uniform electric field through this region.

The collection region 3, with which the multiplication region is in direct contact in the example of FIG. 1, is characterised by an N-type of conductivity and a doping level typically greater than $10^{16}$ $cm^{-3}$. The cadmium composition x of the collection region 3 is for example comprised between 0.4 and 0.45.

The collection region 3 is covered with a passivation layer 4 used to protect the photodiode from an electrical degradation induced by a mechanical or chemical mechanism. A metal pad 5 is localised in and around a hole in the passivation layer 4 in order to have an electrical contact, ideally ohmic, with the collection region 3. An electrical contact (not represented) is also made with the absorption region 1 in order to apply a bias between the absorption and collection regions through the multiplication region. A limitation of the active surface of the multiplication and collection regions may be achieved by means of an etching that defines a mesa shaped pillar and/or by means of a localised formation of the collection layer produced, for example, by ion implantation.

Figure 2:
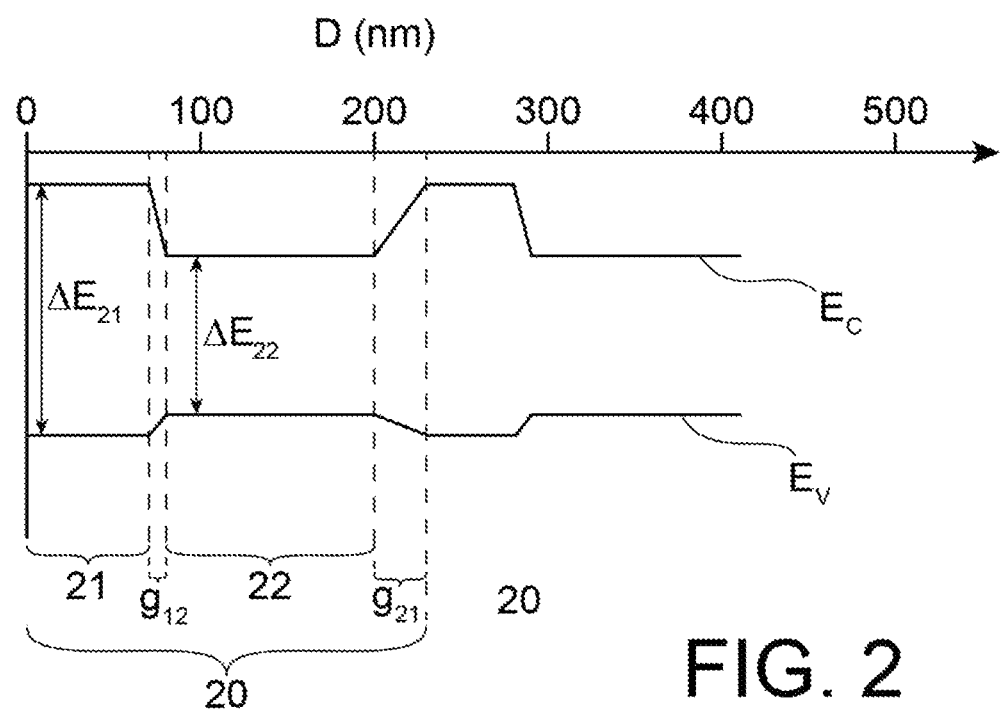
FIG. 2 illustrates the variation in the energy band gap within a multilayer structure of the multiplication region of a photodiode according to the invention.

According to the invention, the multiplication region 2 includes a plurality of multilayer structures 20. Also taking as reference FIG. 2, which represents the variation in the energy band gap that separates the valence Ev and conduction Ec bands in a non-biased multilayer structure, each multilayer structure 20 of the multiplication region includes, from the absorption region 1 to the collection region 3, a first layer 21 having a first energy band gap $\Delta E_{21}$ then a second layer 22 having a second energy band gap $\Delta E_{22}$. The first energy band gap $\Delta E_{21}$ is greater than the second energy band gap $\Delta E_{22}$. In such a way, the second layer 22 has an average carrier multiplication rate per micrometre greater than the average carrier multiplication rate of the first layer 21. To do so, the first and the second layers 21, 22 are made of mercury cadmium tellurides of the type $Cd_xHg_{1-x}Te$ with proportions x of cadmium different from each other, and more particularly a cadmium content $x_{cd1}$ of the first layer greater than the cadmium content $x_{cd2}$ of the second layer with for example $x_{cd1}$=0.45 and $x_{cd2}$=0.34.

During the operation of the photodiode, i.e. when it is subjected to a reverse bias, such as a bias comprised between 10V and 15V, for example 13V, the first layer 21 forms a carrier acceleration layer that increases the energy of the electrons without initiating electron multiplication events whereas the second layer forms a multiplication layer within which are localised the electron multiplication events. The multiplication region according to the invention with a plurality of multilayer structures thus enables an important localisation of multiplication events within the second layers 22. In such a way, the multiplication hazard is reduced and consequently the value of the excess noise factor is decreased.

In a possible embodiment, the variation in gap between the first and second layers is not instantaneous and each multilayer structure 20 includes, from the absorption region 1 to the collection region 2, a layer $g_{12}$ with negative energy band gap gradient between the first layer 21 and the second layer 22 and a layer $g_{21}$ with positive energy band gap gradient after the second layer 22. The negative energy band gap gradient goes from the first energy band gap to the second energy band gap.

In a possible embodiment, the positive energy band gap gradient goes from the second energy band gap to the first energy band gap, in such a way that the multilayer structures have the same energy band gaps $\Delta E_{21}$ and $\Delta E_{22}$ within the first and second layers.

In an alternative embodiment, the first and second band gaps as well as the thicknesses of the first and second layers decrease from one multilayer structure to another from the absorption region to the collection region. The multiplication region thus has a greater gap and thicknesses on the absorption region side than on the collection region side. This alternative makes it possible to reduce the generation of dark current at the start of multiplication on the absorption region side. This alternative may be used to obtain an important gain while reducing, compared to a multiplication region in the form of a layer having a homogeneous cadmium content, the thickness of the multiplication region as well as the reverse bias value.

In a possible embodiment making it possible to guarantee transport by drift and a rapid response time of the photodiode, the layer $g_{21}$ with positive band gap gradient is thicker than the layer $g_{12}$ with negative band gap gradient. The negative gradient is thus steeper than the positive gradient, and the positive gradient increases gradually over a distance corresponding to the thickness $e_{21}$ of the layer $g_{21}$, which makes it possible to obtain a nominal operating electric field $E_f$ greater than $\Delta E_g/e_{21}$ (where $\Delta E_g$ corresponds to the difference in energy between the valence and conduction bands) and thus to ensure a barrier-free transport of carriers for the electrons.

A model describing the gain and excess noise in photodiodes based on CdHgTe has been proposed in the article of J. Rothman et al. entitled "History-Dependent Impact Ionization Theory Applied to HgCdTe e-APDs", Journal of Electronic Materials, n° 40, page 1757, 2011. This model is used hereafter to describe an advantageous embodiment of a photodiode according to the invention, it being understood that this description does not depend on the exactitude of this model but on its main parameters namely a dead space (i.e. the minimum distance that a newly generated electron must travel in order to acquire sufficient energy to create a new impact ionisation event) and a saturation value of the impact ionisation coefficient after the dead space.

Figure 3:
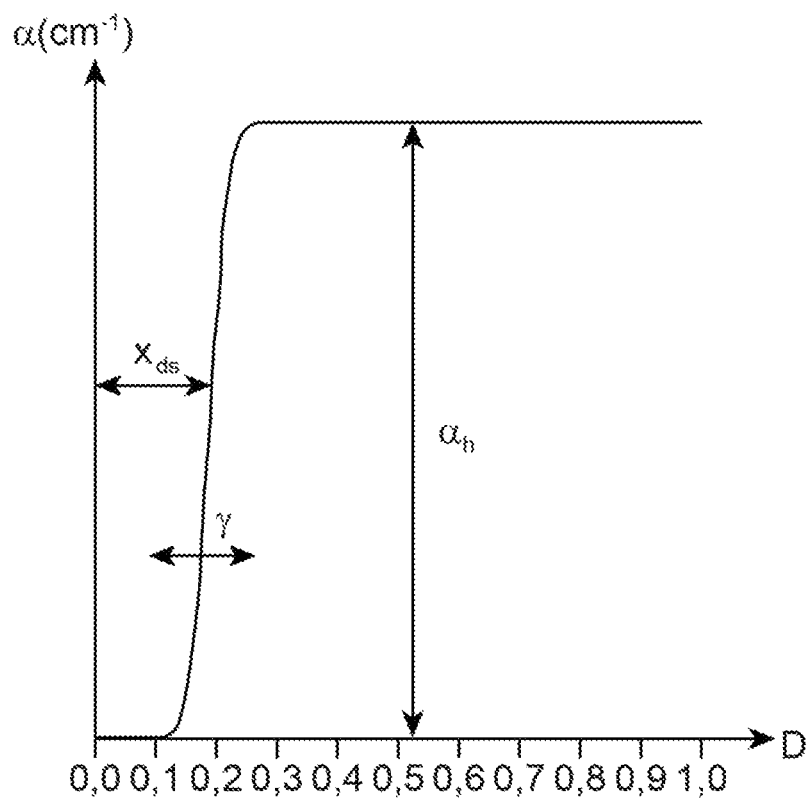
FIG. 3 illustrates an example of variation in the impact ionisation coefficient as a function of the distance traveled by an electron after having been subject to a multiplication event.
Figure 4:
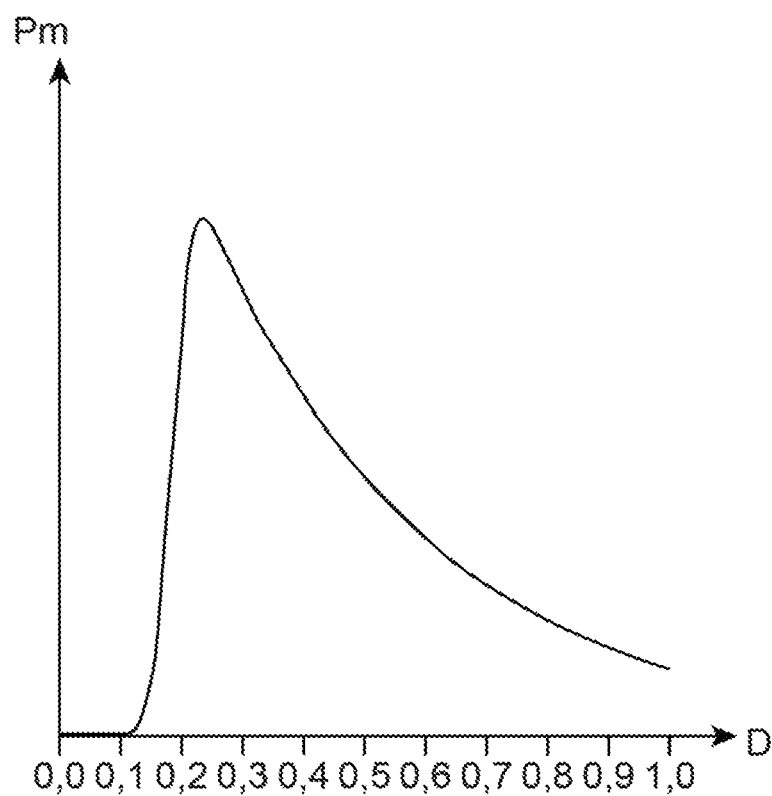
FIG. 4 illustrates, as a function of the same distance D, the multiplication probability density Pm.

In order to obtain low excess noise, less than 2, this article indicates that it is indispensable to use an impact ionisation model that depends on the history of the carrier. Thus, the impact ionisation coefficient α in a position x must take account of a dead space distance $x_{ds}$ after the final multiplication event that has been initiated by or has generated a carrier at a position x' and this article provides the following equation:

$$\alpha(x \mid x') = \frac{\alpha_h\left[\mathrm{erf}\left(\frac{x - x_{ds}}{\gamma x_{ds}}\right) + 1\right]}{2},$$

where erf designates the error function, $\alpha_h$ corresponds to the saturation value of the impact ionisation coefficient after the dead space and γ is a variable that expresses an uncertainty on the dead space by impacting the impact ionisation around the dead space distance. In FIG. 3 is represented an example of variation in the impact ionisation coefficient α according to this model as a function of the distance D (here expressed proportionally to the thickness of the junction) travelled by an electron after having been subject to a multiplication event. In FIG. 4 is represented, as a function of the same distance D, the multiplication probability density Pm.

The variation in the dead space distance $x_{ds}$ and the saturation value $\alpha_h$ of the impact ionisation coefficient after the dead space appear to be determinants for correctly modelling the variation in the gain and excess noise factor as a function of the reverse bias applied to the photodiode. Still in the same article, it has been demonstrated that a good description of the gain may be obtained using a Shockley model of parameters a and b to express the change in the impact ionisation coefficient as a function of the electric field E:

$$\alpha(E) = aE \exp\left(-\frac{b}{E}\right).$$

The variation in the dead space distance $x_{ds}$ is for its part described by $x_{ds}$=ds/E with for example ds=0.8 and γ=0.3.

Thus, in each multilayer structure of the photodiode according to the invention, the first layer 21 has a carrier multiplication rate per micrometre having a first saturation value $\alpha_{h1}$ after a first dead space distance $x_{ds1}$ and the second layer 22 has a carrier multiplication rate per micrometre having a second saturation value $\alpha_{h2}$ after a second dead space distance $x_{ds2}$. These values $\alpha_{h1}$, $\alpha_{h2}$, $x_{ds1}$ and $x_{ds2}$ vary as a function of the energy band gaps $\Delta E_{21}$ and $\Delta E_{22}$ and the operating electric field $E_f$.

In an advantageous embodiment of the invention, the hazard on the dead space is reduced, or even eliminated, in order to reduce the excess noise factor value. To do so, the probability of multiplication in the first layer 21 of the multilayer structures 20 is minimised by playing on its thickness to obtain a quasi-deterministic dead space (i.e. γ≈0) and localise the multiplication events within the second layer 22. To this end, in each multilayer structure, the first layer 21 has a thickness $e_1$ less than the first dead space distance $x_{ds1}$ and at least equal to the second dead space distance $x_{ds2}$: $x_{ds2} \leq e_1 < x_{ds1}$.

And, in each multilayer structure 20, it is possible to provide that the second layer 22 has a thickness $e_2$ greater than a multiplication distance $1/\alpha_{h2}$ corresponding to the inverse of the second saturation value, preferably at least two times greater than said multiplication distance. In such a way, a probability of ionisation by impact in the second layer greater than 70%, preferably greater than 90%, is guaranteed.

In an alternative embodiment, the thickness $e_2$ of the second layer is controlled to limit the occurrence of several multiplications per carrier while maintaining a high probability of ionisation by impact. The optimisation described above of the thickness of the first layer 21 means that it is highly probable that the probability of ionisation by impact for the first multiplication in the second layer 22 is considerably increased after the passage in the first layer 21. This increase is also stimulated by the passage between the high gap material in the first layer and the low gap material in the second layer 22, which induces an additional excess energy. The result is an increase in the saturation value $\alpha_{h2}$ compared to that observed for a multiplication region with homogeneous cadmium content. This increase may be exploited to limit the thickness $e_2$ of the second layer in order to minimise the probability of producing a second multiplication event in the same layer while maintaining a high probability of ionisation in this layer.

It is thus possible to provide that in each multilayer structure the thickness $e_2$ of the second layer 22 is less than the second dead space distance $x_{ds2}$. With a multiplication probability close to unity for each electron entering into a second layer, the multiplication hazard is even further reduced. It will be noted that the reduction in the thickness $e_2$ of the second layer 22 also makes it possible to reduce the probability of inducing a multiplication event in the following first layer. And this reduction in the thickness $e_2$ may make it possible to define an elementary structure of which the total thickness $e_t$ is less than the dead space distance $x_{ds1}$ of the first layer.

Figure 5:
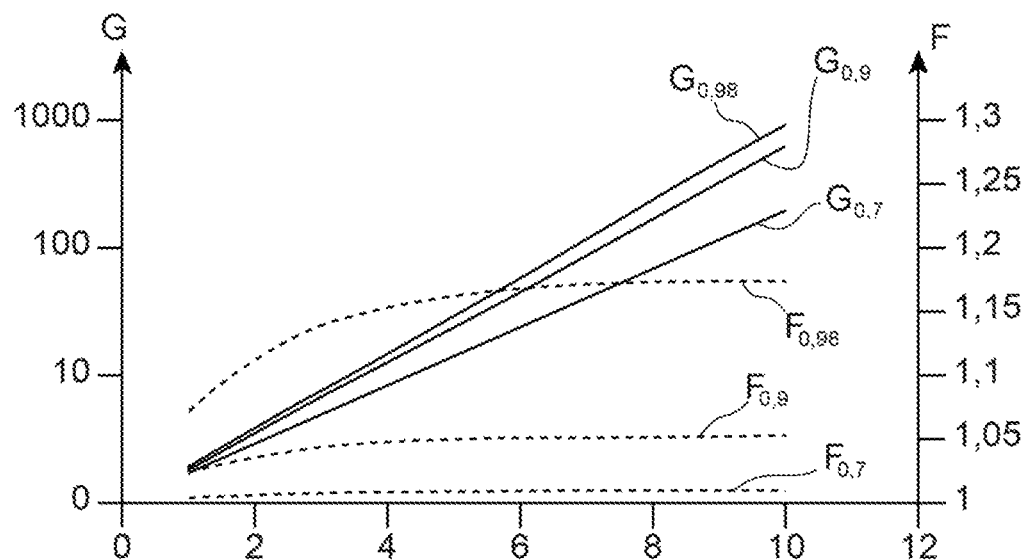
FIG. 5 illustrates gain and excess noise factor values for different photodiodes conforming to the invention.

In FIG. 5 is represented the change in the gain G and excess noise factor F as a function of the number Np of elementary structures in the photodiodes conforming to the invention with probabilities of multiplication (unique) by electron in the second layer respectively of 0.7 (leading to a gain $G_{0.7}$ and to an excess noise factor $F_{0.7}$), of 0.9 (leading to a gain $G_{0.9}$ and to an excess noise factor $F_{0.9}$) and of 0.98 (leading to a gain $G_{0.98}$ and to an excess noise factor $F_{0.98}$). It is recalled that the excess noise factor in HgCdTe photodiodes with multiplication layer with homogeneous cadmium content is of the order of 1.2 to 1.3. A reduced excess noise factor is thus observed for the photodiodes according to the invention. An excess noise factor is notably observed of the order of 1.05 for a probability of ionisation of 0.9, which makes it possible to distinguish efficiently between the simultaneous detection of one photon and the detection of two photons.

Figure 6:
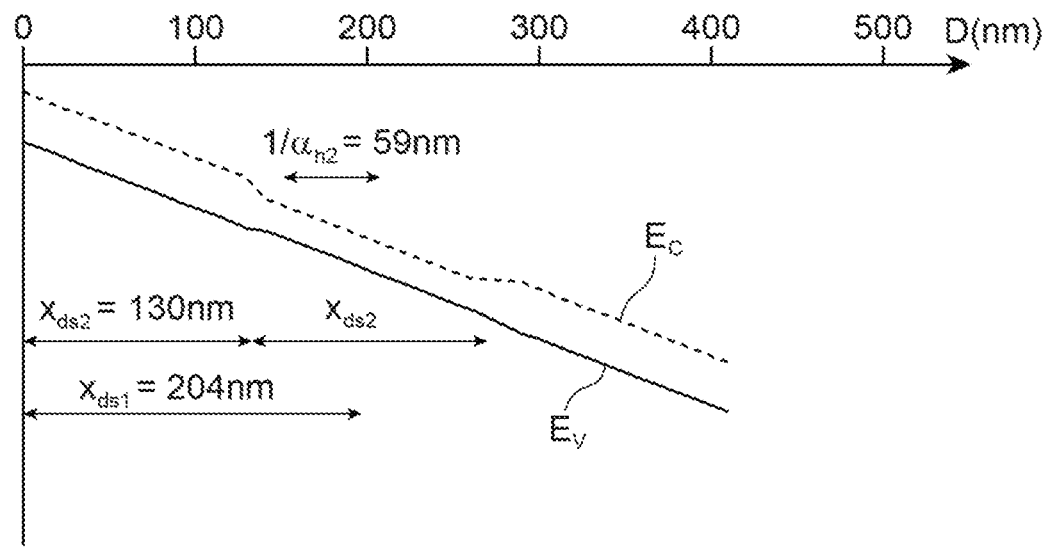
FIG. 6 illustrates the variation in the energy band gap within a multilayer structure subjected to a reverse bias of the multiplication region of a photodiode according to an advantageous embodiment of the invention.

In FIG. 6 is represented the variation in the energy band gap that separates the valence Ev and conduction Ec bands in a multilayer structure under reverse bias of 13V of a photodiode according to an exemplary embodiment of the invention with 7 multilayer structures. In this example, the first layer has a cadmium content $x_{cd1}=0.45$ and a thickness $e_1=130$ nm that is here equal to the second dead space distance $x_{ds2}=130$ nm and less than the first dead space distance $x_{ds1}=204$ nm. The second layer has a cadmium content $x_{cd2}=0.34$ and a thickness $e_2=120$ nm that is greater than the multiplication distance $1/\alpha_{h2}=59$ nm. The negative gradient layer has a thickness of 10 nm and the positive gradient layer has a thickness of 30 nm. The estimated parameters of the ionisation by impact model for each of the first and second layers are the following:

| | ds (V) | γ | a (V$^{-1}$) | b (kV/cm) | $x_{ds}$= ds/E (nm) | $1/\alpha_h$ (nm) |
|---|---|---|---|---|---|---|
| First layer 21 | 1.31 | 0.3 | 2.8 | 59 | 205 | 140 |
| Second layer 22 | 0.83 | 0.3 | 4.4 | 38 | 130 | 59 |

Figure 7:
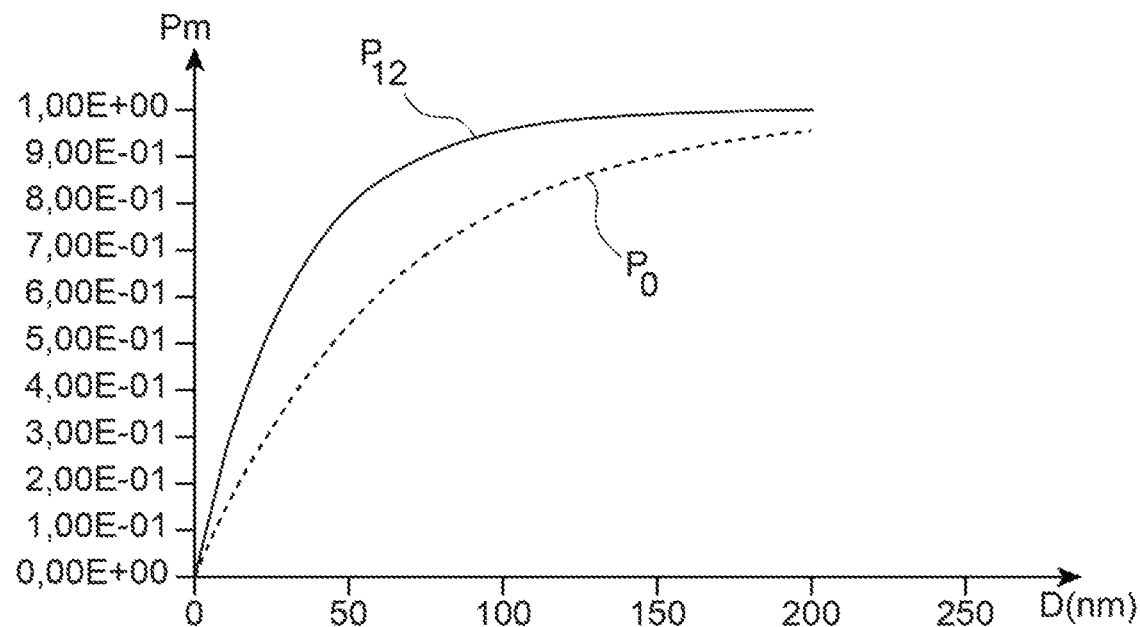
FIG. 7 represent the probabilities of multiplication in a second layer of a multilayer structure of the multiplication region of a photodiode according to the invention.

In FIG. 7, the curve $P_0$ represents the probability of multiplication Pm expected for a carrier in a multiplication region with homogeneous cadmium content at a distance D from the end of the dead space and for a multiplication distance of 59 nm. It may be observed that the probability of multiplication for a thickness of 120 nm is 0.85, which corresponds to a gain of 74 and an excess noise factor of 1.08 for a photodiode with 7 multilayer structures according to the invention. A higher gain with the same excess noise may be obtained with a higher number of multilayer structures in the multiplication region.

As has been seen previously, it is probable that the saturation value of the impact ionisation coefficient in a second layer according to the invention is greater than the expected value in a multiplication region with homogeneous cadmium content. In FIG. 7, the curve $P_{12}$ illustrates the probability of multiplication Pm expected for a carrier in a second layer according to the invention by considering an increase in the saturation value by a factor 2. It may be noted that a probability of 0.98 is reached after 120 nm and that a probability of 0.89 is reached after only 70 nm. It is thus possible to opt for an identical thickness $e_2$ in order to optimise the gain and the excess noise factor or instead reduce this thickness to facilitate the production of a multiplication region respecting the criterion $e_t < x_{ds1}$ while obtaining low excess noise.

Figure 8:
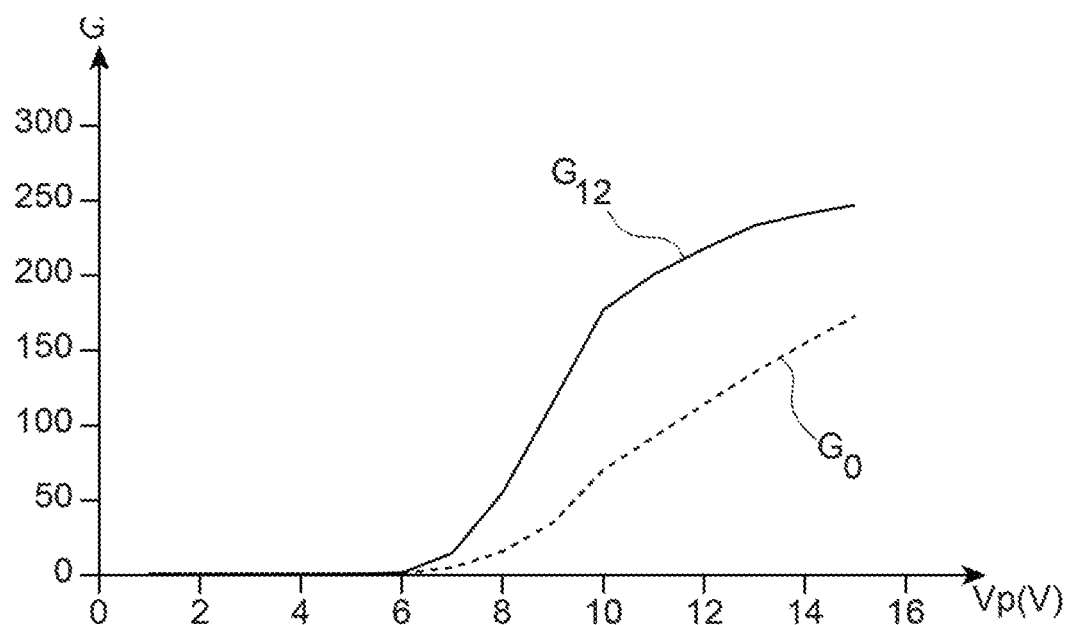
FIGS. 8 and 9 represent respectively the change in the gain and the change in the excess noise factor as a function of the reverse bias voltage.
Figure 9:
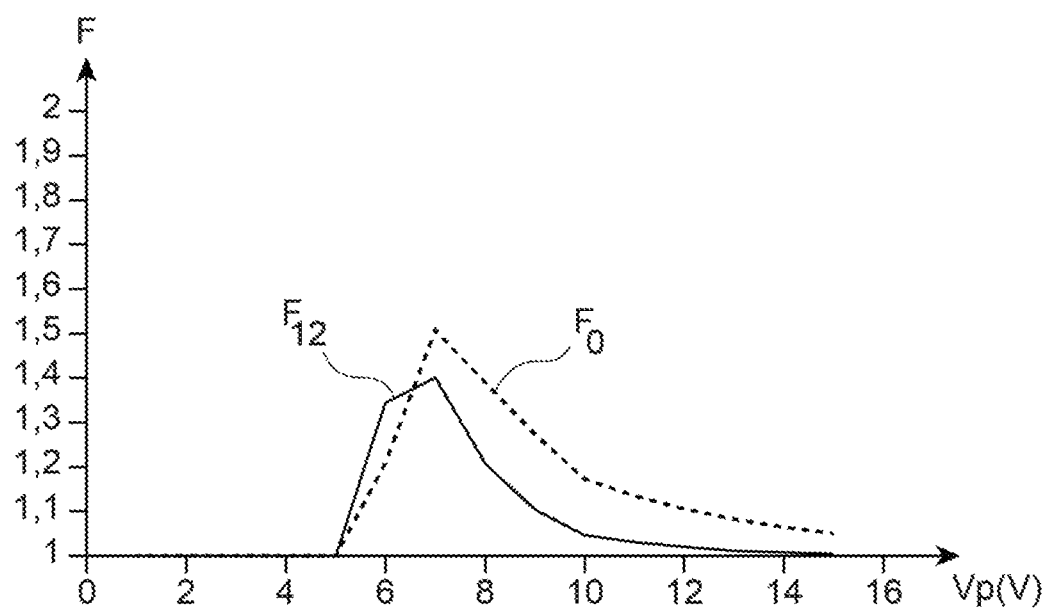

FIGS. 8 and 9 represent respectively an estimation of the change in the gain G and an estimation of the change in the excess noise factor as a function of the reverse bias voltage Vp. In these figures, the curves $G_0$ and $F_0$ represent respectively the change in the gain and the excess noise factor of a photodiode having a multiplication region with homogeneous cadmium content, whereas the curves $G_{12}$ and $F_{12}$ represent respectively the change in the gain and the excess noise factor of a photodiode conforming to the invention including 8 multilayer structures and for which a single multiplication per second layer and an increase in the saturation value by a factor 2 are assumed.

It will be noted that at high bias, the estimation of the gain saturates what is induced by the absence of taking into account a double multiplication per second layer in the model used. Yet, at a bias value greater than 14V, this double multiplication effect becomes important and contributes to an increase in the gain and excess noise. Thus, the model used is no longer valid in the rectangular zones of FIGS. 8 and 9 that correspond to a voltage Vp comprised between 14 and 16V.

It may be deduced from FIG. 9 that, in order to obtain low excess noise, the photodiode according to the invention must be used with a sufficiently high bias to guarantee a high probability of multiplication in the second layer of the multilayer structures. In the example represented, a voltage greater than 9 V must thus be applied to the photodiode according to the invention (12 V for the photodiode multiplication region with homogeneous cadmium content) to observe an excess noise factor less than a value F=1.1. For example a voltage of 12V is chosen to reach an excess noise factor close to unity.

In a possible embodiment of the invention, the thickness of the first layer in the first multilayer structure on the absorption region side is increased, which makes it possible to benefit from a higher impact ionisation coefficient in the second layer of this first multilayer structure (which forms the first multiplication layer of the multiplication region).

In a possible embodiment of the invention, the absorption region has an energy band gap that decreases in the direction of the multiplication region. This decrease may be controlled via the cadmium content. It makes it possible to create an actual electric field that makes it possible to accelerate the transit of carriers towards the multiplication region and to reduce the response time and the temporal instability of the photodiode.

In a possible embodiment of the invention, the photodiode may further include an acceleration layer of carriers of said single type between the multiplication region and the collection region. This acceleration makes it possible to minimise the response time of the photodiode such as for example described in the publication EP 3 267 493 A1.

The invention claimed is:

1. An avalanche photodiode including an absorption region, a collection region and a multiplication region between the absorption region and the collection region, wherein the multiplication region performs a carrier multiplication by impact ionisation of a single type of carrier, wherein the multiplication region includes a plurality of multilayer structures, and wherein, from the absorption region to the collection region, each multilayer structure includes a first layer having a first energy band gap then a second layer having a second energy band gap, the first energy band gap being greater than the second energy band gap, wherein from the absorption region to the collection region, each multilayer structure includes a layer with negative energy band gap gradient between the first layer and the second layer and a layer with positive energy band gap gradient after the second layer.

2. The avalanche photodiode according to claim 1, wherein the first and second energy band gaps and the thicknesses of the first and second layers decrease from one multilayer structure to the other from the absorption region to the collection region.

3. The avalanche photodiode according to claim 1, wherein the first layer of the multilayer structure in contact with the absorption region is thicker than the first layer of the or the other multilayer structures.

4. The avalanche photodiode according to claim 1, wherein the negative energy band gap gradient goes from the first energy band gap to the second energy band gap.

5. The avalanche photodiode according to claim 1, further including an acceleration layer of carriers of said single type between the multiplication region and the collection region.

6. The avalanche photodiode according to claim 1 wherein the layer with positive energy band gap gradient is thicker than the layer with negative energy band gap gradient.

7. The avalanche photodiode according to claim 1, wherein the positive energy band gap gradient goes from the second energy band gap to the first band gap.

8. The avalanche photodiode according to claim 1, wherein the absorption region has an energy band gap that decreases in the direction of the multiplication region.

9. The avalanche photodiode according to claim 1, wherein in each multilayer structure the first layer has a carrier multiplication rate per micrometre having a first saturation value after a first dead space distance, the second layer has a carrier multiplication rate per micrometre having a second saturation value after a second dead space distance and the first layer has a thickness that is at least equal to the second dead space distance and less than the first dead space distance.

10. The avalanche photodiode according to claim 9, wherein in each multilayer structure the second layer has a thickness greater than a multiplication distance corresponding to the inverse of the second saturation value.

11. The avalanche photodiode according to claim 9, wherein in each multilayer structure the thickness of the second layer is less than the second dead space distance.

12. The avalanche photodiode according to claim 11, wherein each multilayer structure has a thickness less than the first dead space distance.

\* \* \* \* \*